(12) United States Patent
Terrovitis (10) Patent No.: US 7,091,784 B1
(45) Date of Patent: Aug. 15, 2006

(54) TUNABLE CIRCUIT INCLUDING A SWITCHABLE INDUCTOR

(75) Inventor: Manolis Terrovitis, Berkeley, CA (US)

(73) Assignee: Atheros Communications, Inc., Santa Clara, CA (US)

( * ) Notice: Subject to any disclaimer, the term of this patent is extended or adjusted under 35 U.S.C. 154(b) by 20 days.

(21) Appl. No.: 10/837,455

(22) Filed: Apr. 29, 2004

Related U.S. Application Data

(60) Provisional application No. 60/550,000, filed on Mar. 3, 2004.

(51) Int. Cl.
*H03F 3/45* (2006.01)
*H03F 3/191* (2006.01)

(52) U.S. Cl. ........................ 330/252; 330/305

(58) Field of Classification Search ................ 330/252, 330/253, 283, 305
See application file for complete search history.

(56) References Cited

U.S. PATENT DOCUMENTS 6,342,813 B1 * 1/2002 Imbornone et al. ......... 330/254
6,411,168 B1   6/2002 Yoshida
6,556,416 B1   4/2003 Kunihiro
6,882,226 B1 * 4/2005 Cho et al. .................... 330/282

* cited by examiner

*Primary Examiner*—Steven J. Mottola
(74) *Attorney, Agent, or Firm*—Bever, Hoffman & Harms, LLP; Jeanette S. Harms (57) ABSTRACT

The frequency of a differential circuit can be advantageously adjusted using a switchable inductor. Specifically, the switchable inductor allows a base inductance to be increased by activating one of a plurality of inductor stages. A switch in an inductor stage can be opened to activate that inductor stage. In one embodiment, the switch can be implemented using a PMOS transistor and closing the switch means turning on the PMOS transistor. Advantageously, the switches have non-ideal behavior when closed which may be mitigated by disposing the switch between differential sides of a circuit, thereby providing a more optimal Q for certain applications. Moreover, the switches ensure that the first and second sides of the differential circuit receive an equal resistance to a virtual ground.

23 Claims, 7 Drawing Sheets

TUNABLE CIRCUIT INCLUDING A SWITCHABLE INDUCTOR

RELATED APPLICATIONS

This application claims priority of U.S. Provisional Patent Application 60/550,000, entitled "System And Method For Communication" filed Mar. 3, 2004.

BACKGROUND OF THE INVENTION

1. Field of the Invention

The present invention relates to inductors and in particular to the use of a switchable inductor to change the tuned frequency of a differential circuit.

2. Discussion of the Related Art

Radio-frequency (RF) integrated circuits commonly use a tuned circuit in which an on-chip inductor resonates with parasitic and non-parasitic capacitances. To tune the frequency of a tank, i.e. a parallel L/C (inductor/capacitor) circuit that can provide high impedance at the frequency of operation, variable capacitors can be used. For example, FIG. 1A illustrates a simplified, tunable gain stage 100 with variable capacitive tuning.

Figure 1A:
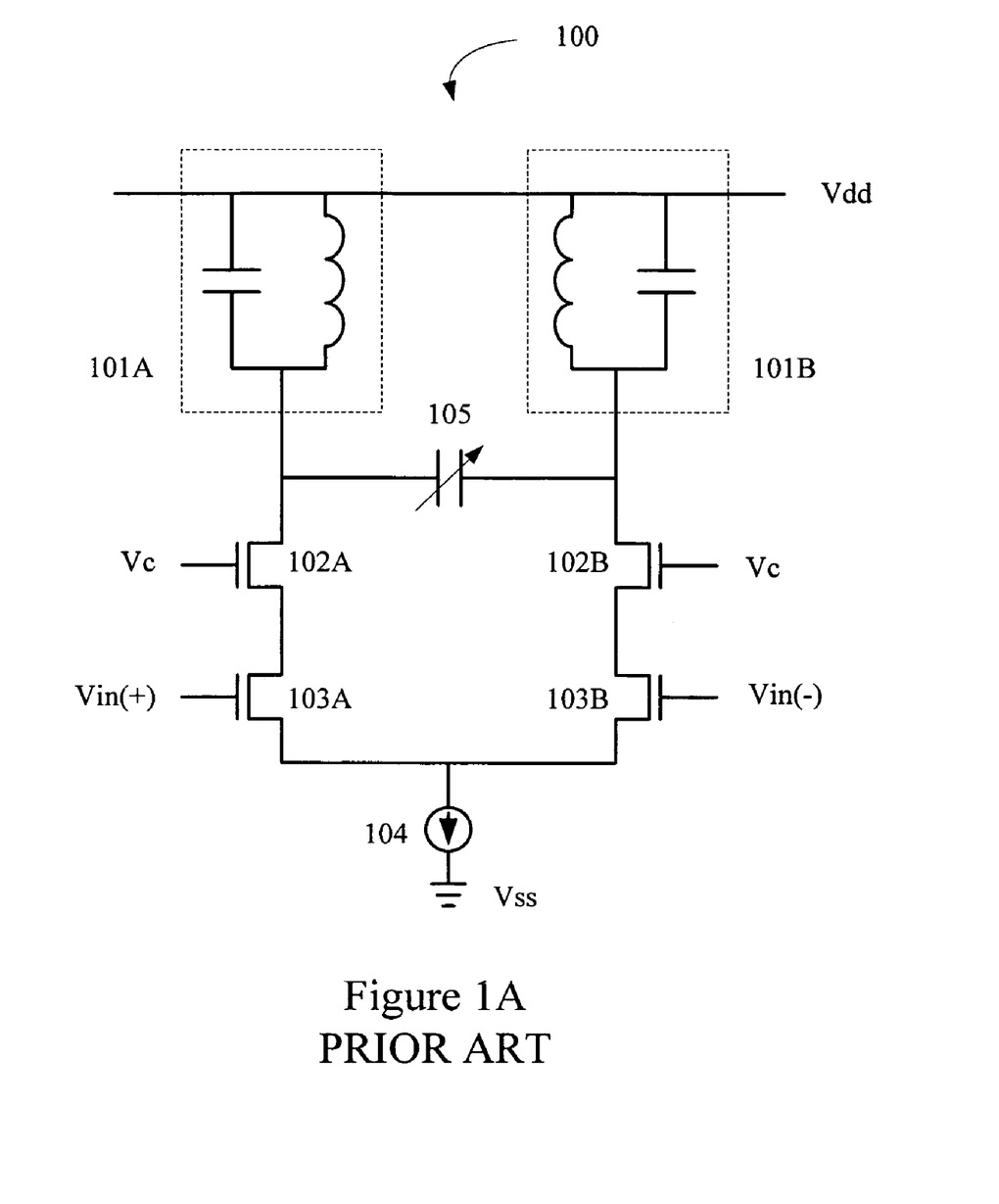
FIG. 1A illustrates a simplified, tunable gain stage with a variable capacitor.

In FIG. 1A, a tank 101A is connected between a high voltage source VDD and a drain of an NMOS transistor 102A. The source of NMOS transistor 102A is connected to a drain of an NMOS transistor 103A. The source of NMOS transistor 103A is connected to a current source 104, which in turn is connected to a low voltage source VSS. Similarly, a tank 101B is connected between a high voltage source VDD and a drain of an NMOS transistor 102B. The source of NMOS transistor 102B is connected to a drain of an NMOS transistor 103B. The source of NMOS transistor 103B is connected to current source 104. In this configuration, tunable gain stage 100 can be implemented as a cascode amplifier, wherein voltage Vc can be a bias voltage of the gates of this amplifier. Voltages Vin(+) and Vin(−) represent the positive and negative voltages applied to gain stage 100.

Figure 1B:
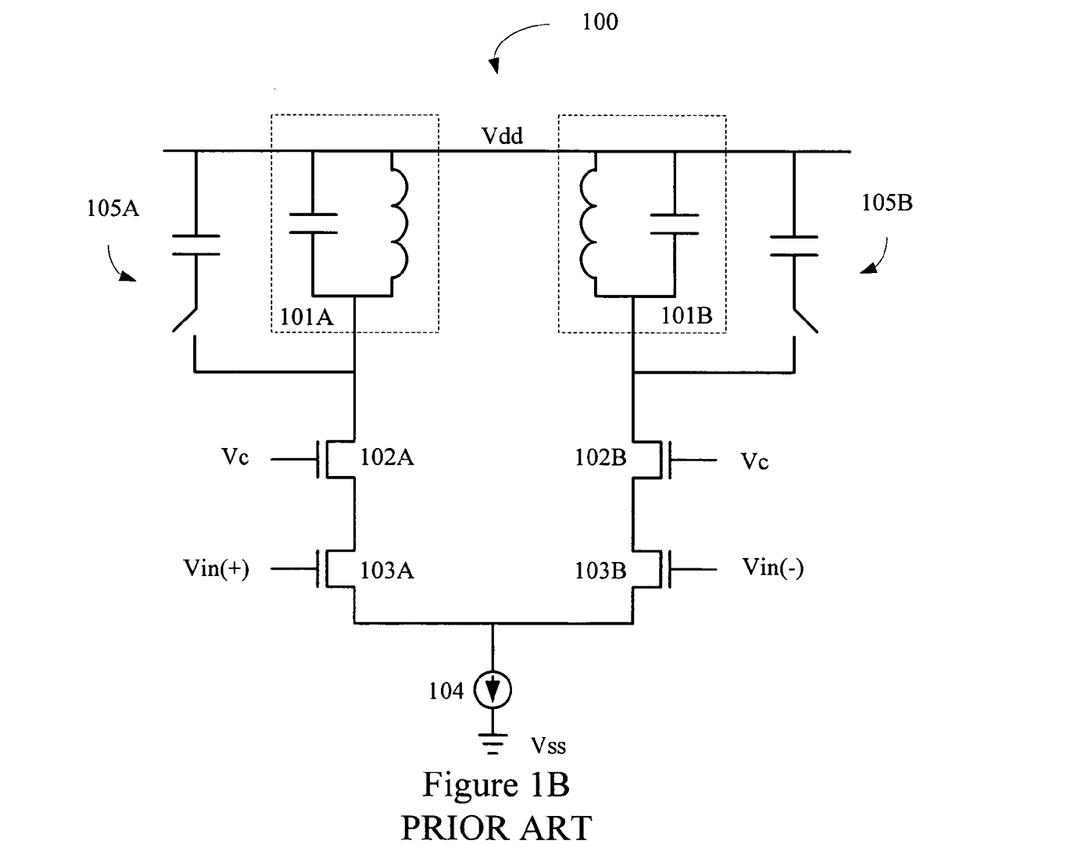
FIG. 1B illustrates an exemplary implementation for a variable capacitor in the gain stage of FIG. 1A.
Figure 1C:
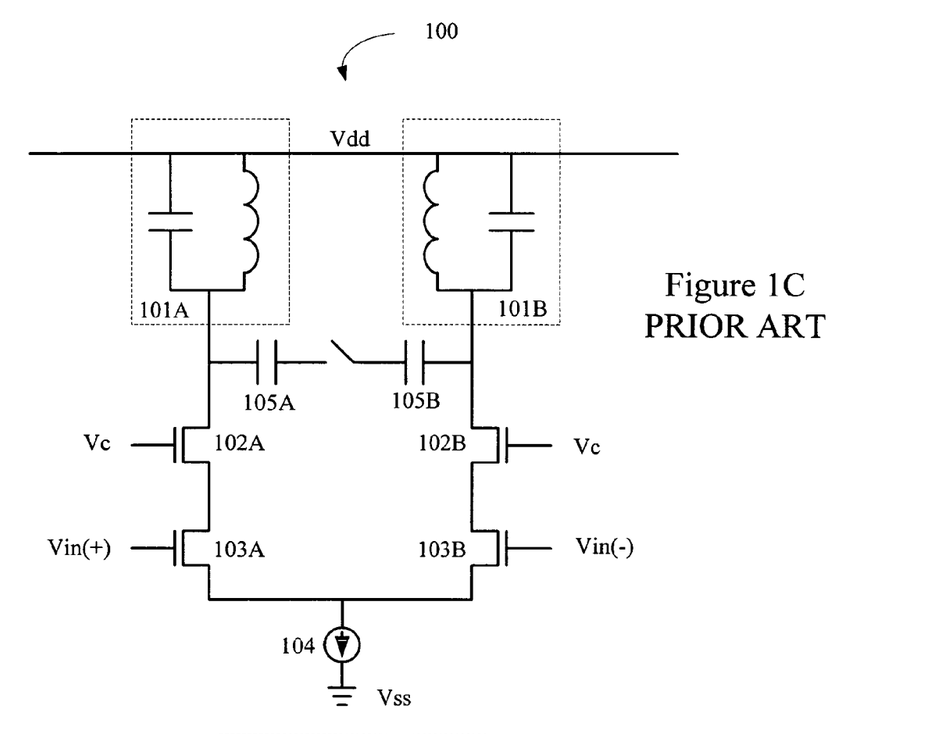
FIG. 1C illustrates another exemplary implementation for variable capacitor in the gain stage of FIG. 1A.

Notably, a variable capacitor 105, which is connected between tanks 101A and 101B, allows gain stage 100 to be tuned capacitively. Variable capacitors can be implemented as fixed capacitors that are connected using switches. For example, FIG. 1B illustrates an exemplary implementation for variable capacitor 105 in gain stage 100. Specifically, variable capacitor 105 can be implemented as switchable capacitors 105A and 105B, wherein each switchable capacitor includes a capacitor and a switch (e.g. implemented using a transistor). FIG. 1C illustrates another exemplary implementation for variable capacitor 105 in which switchable capacitors 105A and 105B share a common switch.

Unfortunately, variable capacitors can have significant disadvantages. For example, variable capacitors can have significant capacitance even in the low capacitance state. Therefore, the inductor in the circuit must be smaller and the gain of the stage must be lower than if variable capacitance was not used.

Figure 1D:
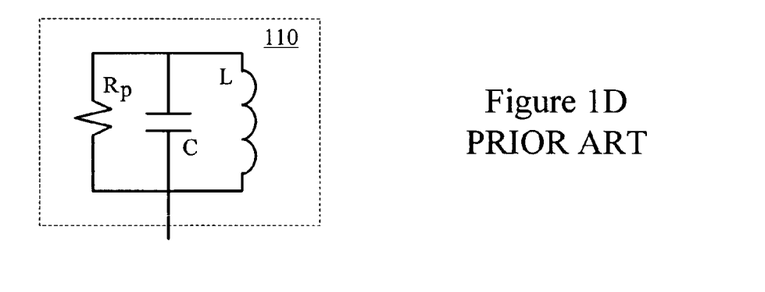
FIG. 1D illustrates a tank in which its loss can be shown as a parallel resistance.

Additionally, the performance in the low frequency band suffers because the equivalent parallel resistance is lower than in the higher frequency band. To better understand this phenomena, note that each tank has an associated loss. For example, FIG. 1D illustrates a tank 110 in which this associated loss can be shown as a parallel resistance $R_p$. Equation (1) computes the parallel resistance $R_p$ for a tank in term of the series resistance $R_s$ of the inductor and the quality factor Q.

$$R_p = R_s(1+Q^2) \qquad \text{Equation (1)}$$

Equation (2) recognizes that the quality factor Q is equivalent to $Lw/R_s$, wherein L is the inductance and w is the angular frequency of operation.

$$R_p = R_s(1+(Lw/R_s)^2) \qquad \text{Equation (2)}$$

Logically, referring to Equation (2), the parallel resistance $R_p$ drops at lower frequencies.

However, note that $w=1/\sqrt{LC}$, $(Lw/R_s)^2 = L/CR_s$, wherein C is the capacitance. Thus, for higher performance (and thus higher parallel resistance $R_p$), the inductance L is preferably increased or the capacitance C decreased. Therefore, a need arises for a tunable differential circuit that can advantageously increase inductance.

SUMMARY OF THE INVENTION

In accordance with one feature of the invention, a tunable differential circuit can include a switchable inductor. This switchable inductor can include a base inductor pair and a plurality of inductor stages coupled between the base inductor pair and a voltage source. The base inductor pair can include a first base inductor on a first side of the differential circuit and a second base inductor on a second side of the differential circuit. The remainder of the components in the differential circuit can be provided in operative relation to the base inductor pair.

Notably, each inductor stage can include a first incremental inductor on the first side of the differential circuit, a second incremental inductor on the second side of the differential circuit, and a switch connecting the first and second incremental inductors. In one embodiment, the switch can be implemented as a PMOS transistor. The first and second incremental inductors can each provide a predetermined incremental inductance to the base inductance provided by each of the first and second base inductors.

In one embodiment, the base and incremental inductors on each side of the differential circuit can be formed using discrete inductors. In another embodiment, the base and incremental inductors on each side of the differential circuit can be formed using a single inductor having multiple taps.

In one layout, the switchable inductor can be implemented with inductors formed using mirror symmetry and the plurality of components can also be formed using mirror symmetry. In another layout, the switchable inductor can be implemented with inductors formed using step symmetry and the plurality of components can be formed using mirror symmetry.

A method of adjusting a frequency of a differential circuit including a tank is also provided. This method can include using the switchable inductor to change an inductance of the tank. Specifically, the switchable inductor allows a base inductance to be increased by activating one of the inductor stages. Specifically, a switch in an inductor stage can be opened to activate an inductor stage or closed to bypass that inductor stage. In one embodiment, the switch can be implemented using a PMOS transistor and closing the switch means turning on the PMOS transistor. Advantageously, the switches, disposed between differential nodes, mitigate non-ideal behavior when closed. Moreover, the disposition of the switches between differential nodes ensure that the first and second sides of the differential circuit receive an equal resistance approximately one-half the value of the on-state resistance of the PMOS transistor to a virtual ground formed therebetween.

A method of allowing a frequency of a differential circuit to be tuned inductively is also provided. This method includes providing the switchable inductor and coupling the switchable inductor between a voltage source and other components of the differential circuit. Each inductor stage can add an incremental inductance to a base inductance. Specifically, each inductor stage can include a switching element for activating an inductor stage. Advantageously, the switching element, when closed, ensures its resistance is divided equally between two sides of the differential circuit.

DETAILED DESCRIPTION OF THE FIGURES

Figure 2:
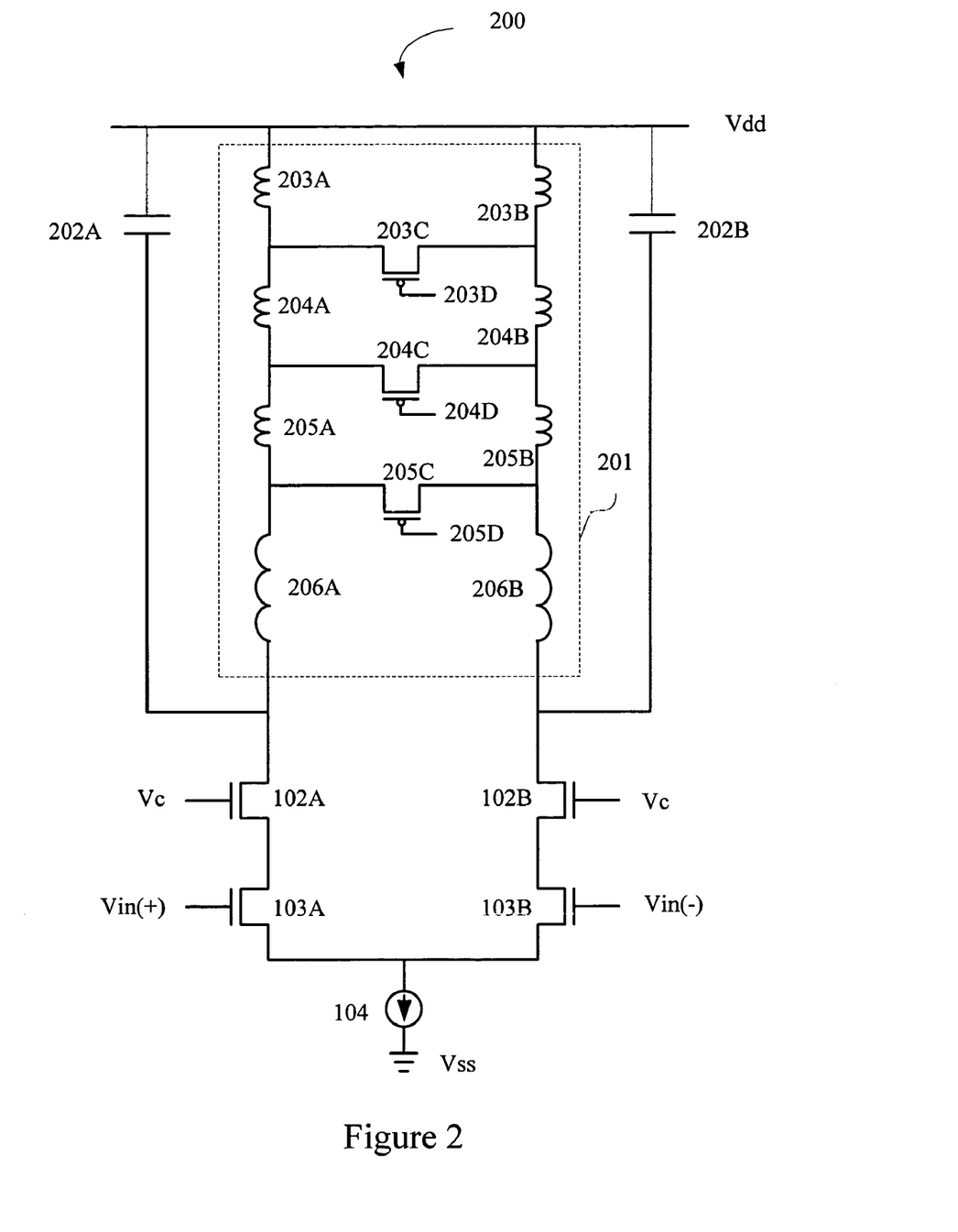
FIG. 2 illustrates an exemplary tunable circuit including a switchable inductor.

In accordance with one feature of the invention, a switchable inductor can be used to tune the frequency of a differential circuit. FIG. 2 illustrates an exemplary tunable differential circuit 200 including a switchable inductor 201 and capacitors 202A/202B. Switchable inductor 201 and capacitors 202A/202B form the tanks of differential circuit 200.

In differential circuit 200, inductors 203A, 204A, 205A and 206A are connected in series between high voltage source Vdd and the drain of NMOS transistor 102A. Similarly, inductors 203B, 204B, 205B and 206B are connected in series between high voltage source Vdd and the drain of NMOS transistor 102B. Note that components having the same reference numeral (e.g. NMOS transistors 102A/102B and 103A/103B, as well as current source 104) refer to the same components and therefore their descriptions are not repeated.

A PMOS transistor 203C, which receives a control signal 203D, is connected between inductors 203A and 203B. A PMOS transistor 204C, which receives a control signal 204D, is connected between inductors 204A and 204B. A PMOS transistor 205C, which receives a control signal 205D, is connected between inductors 205A and 205B.

Notably, the parallel coupling of transistors 203C, 204C, and 204C can form inductance stages of switchable inductor 201. For example, inductors 203A/203B and PMOS transistor 203C can form a first inductance stage of switchable inductor 201. Similarly, inductors 204A/204B and PMOS transistor 204C can form a second inductance stage of the switchable inductor, and inductors 205A/205B and PMOS transistor 205C can form a third inductance stage of switchable inductor 201.

In this embodiment of differential circuit 200, PMOS transistors implement switching elements for the inductance stages. Note that NMOS transistors could be used in lieu of the PMOS transistors in differential circuit 200. However, and described in further detail below, a transistor that is conducting, i.e. is "on", is preferably fully on to short the two sides of the differential circuit. A logic low control signal can turn off an NMOS transistor and a logic high control signal can turn on an NMOS transistor. A fully on NMOS transistor may require a voltage higher than the high voltage supply, thereby creating potentially complex power supply issues. Moreover, this higher voltage requirement could necessitate thicker oxide for these NMOS transistors to minimize performance problems, thereby undesirably resulting in a more complex fabrication. In contrast, a logic low control signal can turn on a PMOS transistor and a logic high control signal can turn off a PMOS transistor. Therefore, in a circuit where a fully on transistor state and low voltage use are desirable, using PMOS transistors for switches to change inductance stages can be advantageous.

Alternatively, NMOS switch elements may be used without the disadvantages discussed above if PMOS transistors form the active differential elements and the circuit is inverted such that the inductor chains are connected to Vss.

Each of inductors 203A/203B, 204A/204B, and 205A/205B can provide a $\Delta L$ (i.e. an incremental inductance) and therefore can be referenced as incremental inductors. In one embodiment, the incremental inductors in different stages can be sized to provide the same $\Delta L$. In other embodiments, the incremental inductors in different stages can be sized to provide different $\Delta L$s.

Each of inductors 206A and 206B can provide an inductance L (i.e. a base inductance) and therefore can be referenced as base inductors. Notably, the base inductance can be increased by turning off one or more of PMOS transistors 203C, 204C, and 205C. Specifically, the base inductance is obtained when transistor 205C is turned on (closed). The smallest increment of inductance provided by differential circuit 200 would be provided when transistor 205C is turned off (i.e. control signal 205D is logic high) and at least transistor 204C is turned on (i.e. control signals 204D/203D are logic low). The next increment of inductance can be provided by turning off transistors 205C/204C (i.e. providing logic high control signals 205D/204D) and turning on transistor 203C (i.e. providing a logic low control signal 203D). The next increment of inductance can be provided by turning off transistors 205C/204C/203C (i.e. providing logic high control signals 205D/204D/203D).

Each of PMOS transistors 203C/204C/205C functions as a non-ideal switch having a resistance when on. Notably, when these transistors are placed on an axis of symmetry for the differential circuit, a virtual ground is located in the middle of the differential circuit. Thus, PMOS transistors 203C/204C/205C can advantageously ensure that this on-resistance is divided equally between the two sides of the differential circuit. This division effectively halves the value of the PMOS transistor's non-ideal resistance presented to each side of the differential circuit.

In accordance with one aspect of switchable inductor 201, the on-resistance of PMOS transistors 203C/204C/205C can significantly reduce the Q of the tank. Of importance, some applications perform optimally with a low Q tuned circuit. Note that in some circuits a high Q could result in a circuit oscillating at a non-driven (and thus undesirable) frequency. Therefore, the low Q can actually provide desirable control over the driven frequency.

Figure 3A:
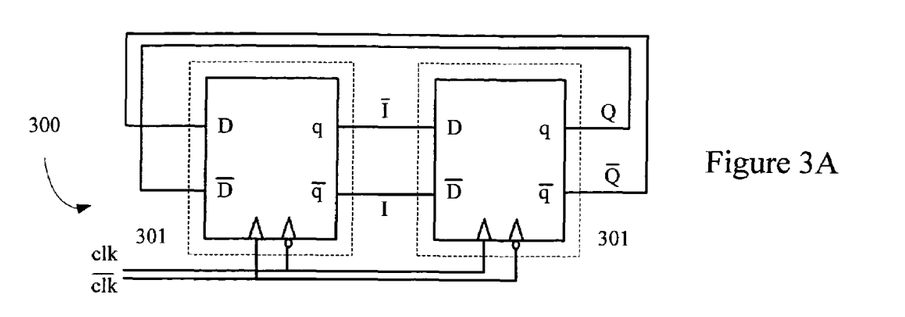
FIG. 3A illustrates a high frequency divider, which performs well with a low Q tuned circuit.
Figure 3B:
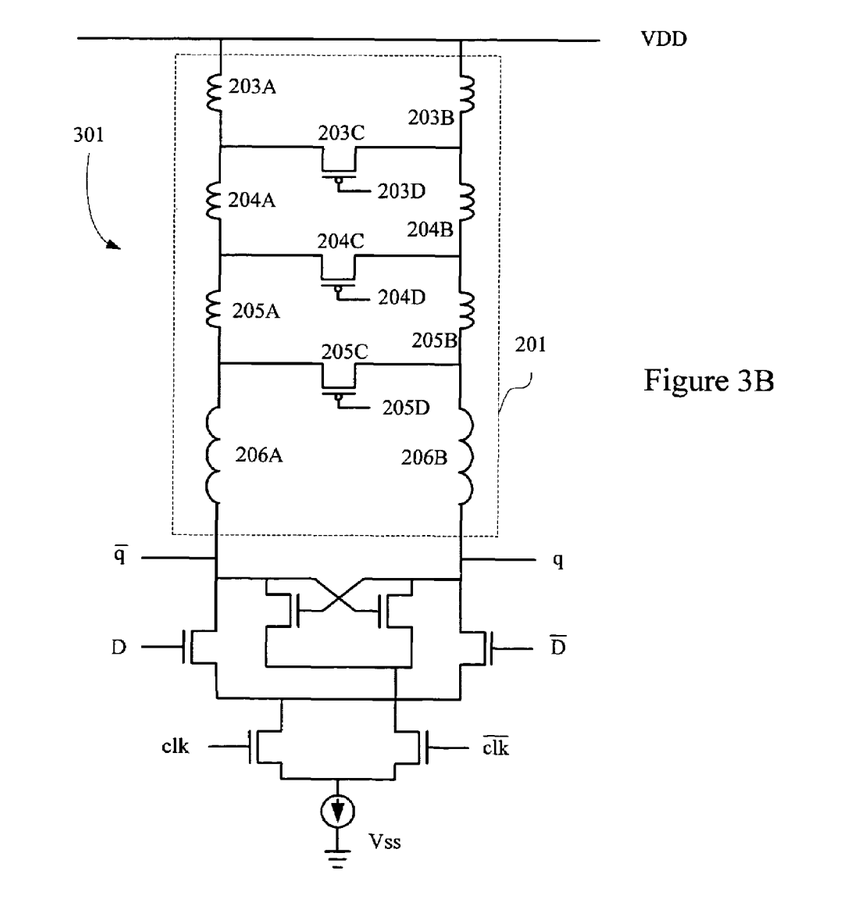
FIG. 3B illustrates an exemplary flip-flop that can include a switchable inductor for tuning.

FIG. 3A illustrates a high frequency divider (i.e. a divide-by-2 divider) 300, which performs well with a low Q tuned circuit. Divider 300 can include two current-mode flip-flops 301 coupled in a feedback loop and receiving a clock signal clk (and clk bar) from a voltage-controlled oscillator (VCO) (signals I, Ibar, Q, and Qbar are shown for reference). FIG. 3B illustrates an exemplary flip-flop 301 that can include switchable inductor 201 (FIG. 2).

In one embodiment, the base and incremental inductors can be implemented using individual discrete inductors. In another embodiment, the base and incremental inductors on one side of the differential circuit can be implemented as a single inductor with multiple taps.

Figure 4:
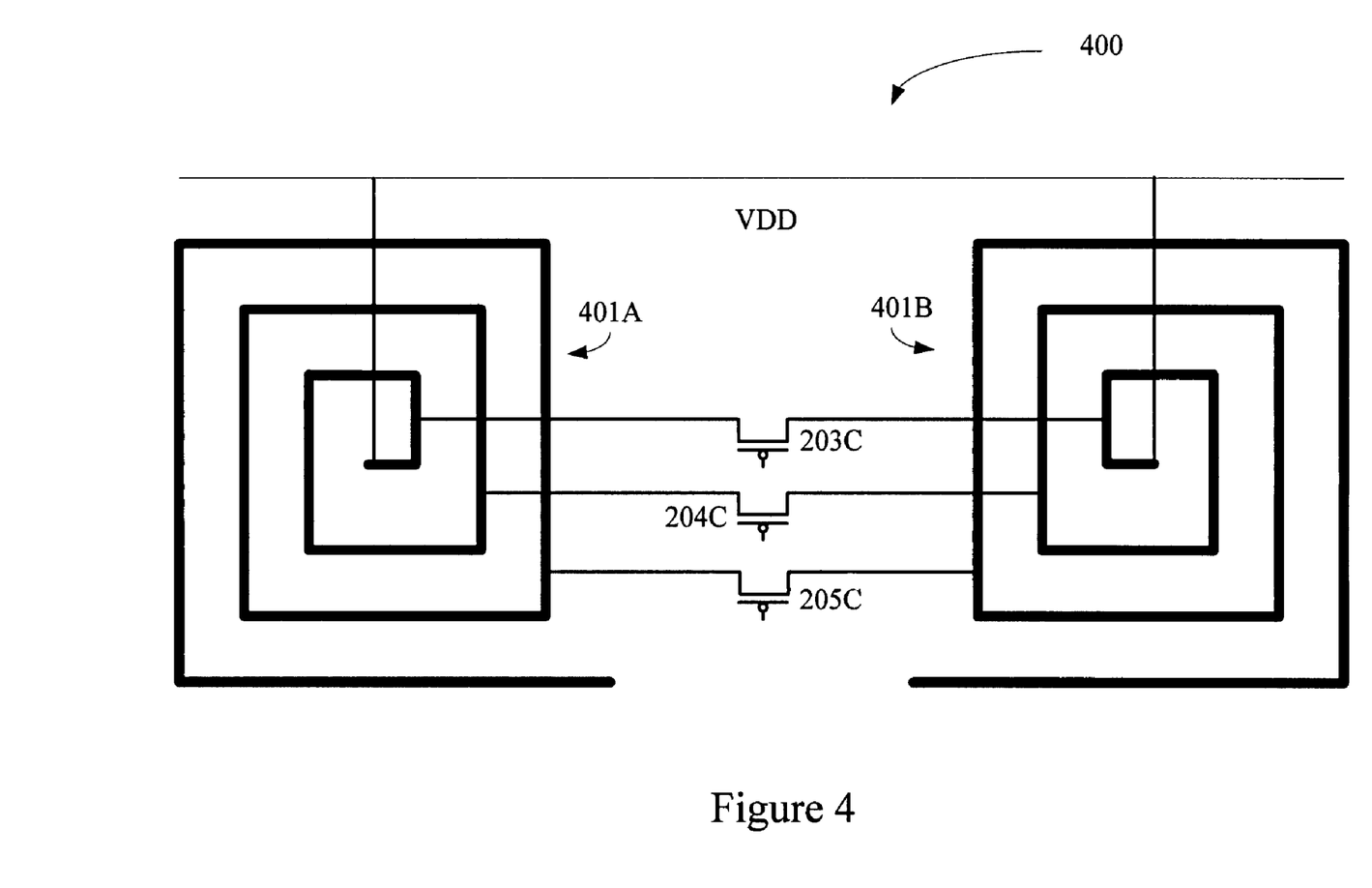
FIG. 4 illustrates a layout including an exemplary inductor pair formed using mirror symmetry that can implement the switchable inductor of FIG. 2.

FIG. 4 illustrates a layout 400 including an exemplary inductor pair 401A and 401B formed using mirror symmetry that can implement the switchable inductor of FIG. 2. For example, transistors 203C, 204C, and 205C are shown connected between three different coils of inductors 401A and 401B to implement the three inductor stages of the switchable inductor. In this embodiment, the other components in the differential circuit (not shown) can be formed using mirror symmetry.

Figure 5:
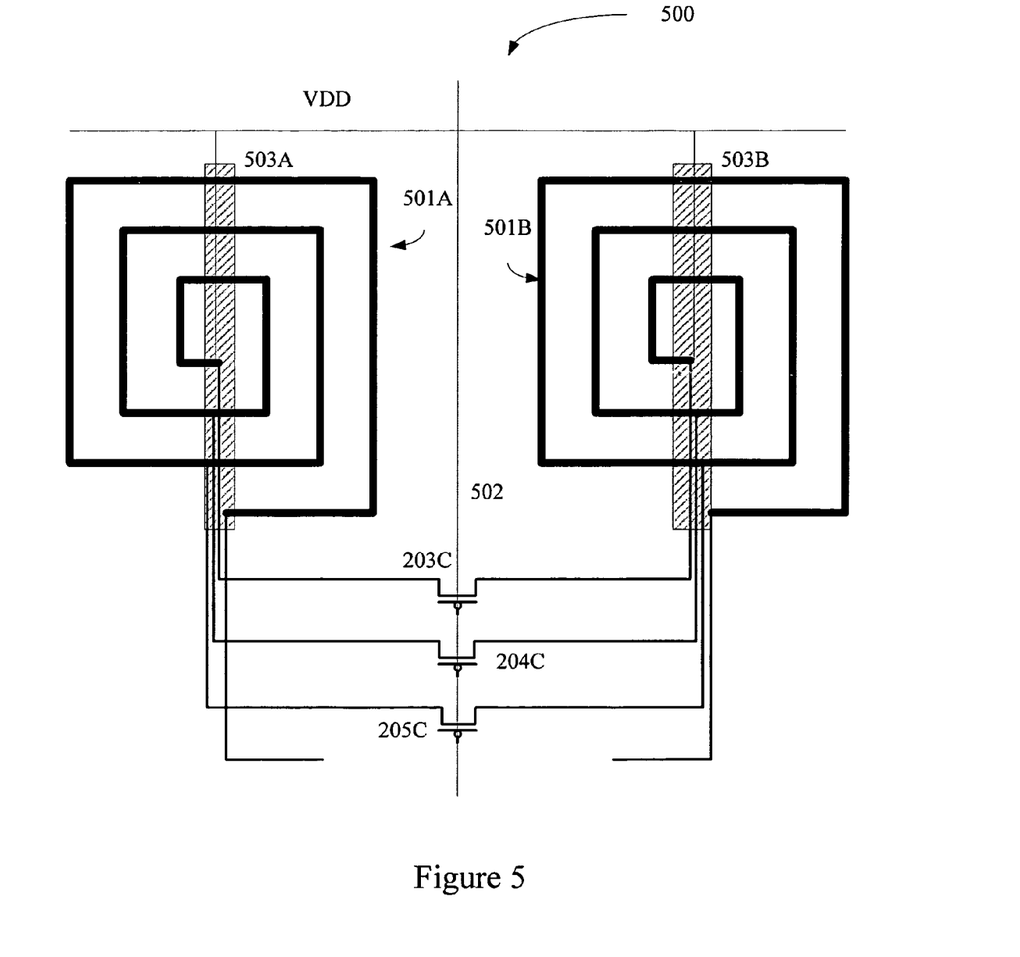
FIG. 5 illustrates a layout including an exemplary inductor pair formed using step symmetry that can implement the switchable inductor of FIG. 2.

FIG. 5 illustrates a layout 500 including an exemplary inductor pair 501A and 501B formed using step symmetry that can implement the switchable inductor of FIG. 2. For example, transistors 203C, 204C, and 205C are shown connected between three different coils of inductors 501A and 501B to implement the three stages of the switchable inductor.

In one embodiment, inductors 501A and 501B can be formed using step symmetry and the other components in the differential circuit can be formed using mirror symmetry. Thus, for example, transistors 203C, 204C, and 205C can be formed using mirror symmetry based on an axis 502. To facilitate this mixed symmetry, the connections between inductor 501A and other components in the circuit can be formed on an axis 503A (which is in the middle of inductor 501A) and the connections between inductor 501B and other components in the circuit can be formed on an axis 503B (which is in the middle of inductor 501B).

Note that these connections, which are slightly staggered for easier viewing, can be provided on the same side of the inductor or on opposite sides (as shown in FIG. 5). In one embodiment, these connections can be formed in different metal layers. U.S. patent application Ser. No. 10/836,160, entitled "INDUCTOR LAYOUT USING STEP SYMMETRY FOR INDUCTORS" and filed by Atheros Communications, Inc. on Apr. 29, 2004, describes this mixed symmetry in further detail and is incorporated by reference herein.

Although illustrative embodiments have been described in detail herein with reference to the accompanying figures, it is to be understood that the invention is not limited to those precise embodiments. They are not intended to be exhaustive or to limit the invention to the precise forms disclosed. As such, many modifications and variations will be apparent to practitioners skilled in this art.

For example, in one embodiment of a dynamic configuration, a control circuit (e.g. a logic circuit and shift register) can respond to an unknown parasitic capacitance determined during standard operation to automatically provide the appropriate control signals 203D, 204D, and 205D. In another embodiment of a static configuration, if the parasitic capacitance is known, then control signals 203D, 204D, and 205D can be set prior to use.

Note that any number of inductor stages can be provided in the differential circuit depending on its application. Further note that inductor stages can be activated in any order. For example, if the smallest inductance stage is significantly less than a desired inductance, then one or more inductance stages could be skipped to more quickly find that desired inductance. In one embodiment, an intermediate inductance stage could be tried first with an adjacent inductance stage (increasing or decreasing inductance, as desired) being tried next. Accordingly, it is intended that the scope of the invention be defined by the following Claims and their equivalents.

The invention claimed is:

1. A tunable differential circuit comprising:
   a switchable inductor including at least one pair of inductors selectively connected across sides of a differential circuit using a switching element, wherein the switching element, when closed, ensures that the sides of the differential circuit receive an equal resistance; and
   a plurality of components in operative relation to the switchable inductor.

2. A tunable differential circuit comprising:
   a switchable inductor including:
      a base inductor pair comprising a first base inductor on a first side of the differential circuit and a second base inductor on a second side of the differential circuit; and
      at least one inductor stage coupled between the base inductor pair and a voltage source, each inductor stage including incremental inductors connectable across the first and second sides of the differential circuit; and
   a plurality of components in operative relation to the base inductor pair.

3. A tunable differential circuit comprising:
   a switchable inductor including:
      a base inductor pair comprising a first base inductor on a first side of the differential circuit and a second base inductor on a second side of the differential circuit; and
      at least one inductor stage coupled between the base inductor pair and a voltage source; and
   a plurality of components in operative relation to the base inductor pair, wherein each inductor stage includes:
      a first incremental inductor on the first side of the differential circuit;
      a second incremental inductor on the second side of the differential circuit; and
      a switch connecting the first and second incremental inductors.

4. The tunable differential circuit of claim 3, wherein the switch includes a PMOS transistor.

5. The tunable differential circuit of claim 3, wherein each of the first and second incremental inductors can provide a predetermined incremental inductance.

6. The tunable differential circuit of claim 3, wherein the base and incremental inductors on each side of the differential circuit are formed using discrete inductors.

7. The tunable differential circuit of claim 3, wherein the base and incremental inductors on each side of the differential circuit are formed using a single inductor having multiple taps.

8. A tunable differential circuit comprising:
   a switchable inductor including:
      a base inductor pair comprising a first base inductor on a first side of the differential circuit and a second base inductor on a second side of the differential circuit; and at least one inductor stage coupled between the base inductor pair and a voltage source; and
a plurality of components in operative relation to the base inductor pair, wherein the switchable inductor is implemented with inductors formed using mirror symmetry and the plurality of components are also formed using mirror symmetry.

9. A tunable differential circuit comprising:
a switchable inductor including:
    a base inductor pair comprising a first base inductor on a first side of the differential circuit and a second base inductor on a second side of the differential circuit; and
    at least one inductor stage coupled between the base inductor pair and a voltage source; and
a plurality of components in operative relation to the base inductor pair, wherein the switchable inductor is implemented with inductors formed using step symmetry and the plurality of components are formed using mirror symmetry.

10. The tunable differential circuit of claim 3, wherein the switches have non-ideal behavior when closed.

11. The tunable differential circuit of claim 3, wherein the switches ensure that the first and second sides of the differential circuit receive an equal resistance to a virtual ground.

12. A method of adjusting a frequency of a differential circuit including a tank, the method comprising:
using a switchable inductor to change an inductance of the tank, the switchable inductor including at least one inductor stage, each inductor stage including an inductor pair connectable across the differential circuit using a switching element, wherein the switchable inductor allows a base inductance to be increased and the switching element, when closed, ensures that the sides of the differential circuit receive an equal resistance.

13. A method of adjusting a frequency of a differential circuit including a tank, the method comprising:
using a switchable inductor to change an inductance of the tank, the switchable inductor including at least one inductor stage, each inductor stage including an inductor pair connectable across the differential circuit, wherein the switchable inductor allows a base inductance to be increased, wherein the switchable inductor includes:
a base inductor pair; and
the at least one inductor stage coupled between the base inductor pair and a voltage source,
wherein using the switchable inductor to change the inductance includes activating one of the at least one inductor stage.

14. A method of adjusting a frequency of a differential circuit including a tank, the method comprising:
using a switchable inductor to change an inductance of the tank, wherein the switchable inductor allows a base inductance to be increased, wherein the switchable inductor includes:
a base inductor pair; and
at least one inductor stage coupled between the base inductor pair and a voltage source,
wherein using the switchable inductor to change the inductance includes activating one of the at least one inductor stage,
wherein the base inductor pair includes:
    a first base inductor on a first side of the differential circuit and a second base inductor on a second side of the differential circuit,
wherein each inductor stage includes:
    a first incremental inductor on the first side of the differential circuit;
    a second incremental inductor on the second side of the differential circuit; and
    a switch connecting the first and second incremental inductors, and
wherein using the switchable inductor to change the inductance includes closing a switch of an inductor stage.

15. The method of claim 14, wherein the switch is a PMOS transistor and closing the switch includes turning on the PMOS transistor.

16. A method of allowing a frequency of a differential circuit to be tuned inductively, the method comprising:
providing a switchable inductor including at least one inductor stage having inductors selectively connectable across sides of the differential circuit using a switching element, wherein the switching element, when closed, ensures that the sides of the differential circuit receive an equal resistance; and
coupling the switchable inductor between a voltage source and other components of the differential circuit.

17. A method of allowing a frequency of a differential circuit to be tuned inductively, the method comprising:
providing a switchable inductor including at least one inductor stage having inductors selectively connectable across sides of the differential circuit; and
coupling the switchable inductor between a voltage source and other components of the differential circuit, wherein the at least one inductor stage can add an incremental inductance to a base inductance.

18. A method of allowing a frequency of a differential circuit to be tuned inductively, the method comprising:
providing a switchable inductor including at least one inductor stage having inductors selectively connectable across sides of the differential circuit; and
coupling the switchable inductor between a voltage source and other components of the differential circuit, wherein each inductor stage includes a switching element for activating an inductor stage and ensuring that the sides of the differential circuit receive an equal resistance when the switching element is closed.

19. A method of allowing a frequency of a differential circuit to be tuned inductively, the method comprising:
providing a switchable inductor including at least one inductor stage having inductors selectively connectable across sides of the differential circuit; and
coupling the switchable inductor between a voltage source and other components of the differential circuit, wherein each inductor stage includes a switching element that when closed ensures its resistance is divided equally between two sides of the differential circuit in reference to a virtual ground.

20. A method of allowing a frequency of a differential circuit to be tuned inductively, the method comprising:
providing a switchable inductor;
coupling the switchable inductor between a voltage source and other components of the differential circuit:
using step symmetry for providing the switchable inductor; and
using mirror symmetry for coupling the switchable inductor between a voltage source and other components of the differential circuit.

21. A tunable differential circuit comprising:
a switchable inductor for providing at least one selectable inductance, the switchable inductor including at least one inductor stage having inductors selectively connectable across sides of the tunable differential circuit using a switching element, wherein the switching element, when closed, ensures that the sides of the differential circuit receive an equal resistance; and a plurality of components in operative relation to the switchable inductor.

22. A tunable differential circuit comprising:

a switchable inductor for providing at least one selectable inductance, the switchable inductor including:
- a base inductor pair comprising a first base inductor on a first side of the differential circuit and a second base inductor on a second side of the differential circuit; and
- at least one inductor stage coupled between the base inductor pair and a voltage source, the at least one inductor stage including inductors selectively connectable across the first and second sides of the differential circuit; and a plurality of components in operative relation to the base inductor pair.

23. A method of allowing a frequency of a differential circuit to be tuned inductively, the method comprising:

providing a switchable inductor for selecting one of a plurality of inductances;

ensuring that sides of the differential circuit receive an equal resistance when a switching element of the switchable inductor is closed; and coupling the switchable inductor between a voltage source and other components of the differential circuit.

* * * * *